US007687119B2

(12) United States Patent
Cao et al.

(10) Patent No.: US 7,687,119 B2
(45) Date of Patent: *Mar. 30, 2010

(54) RADIATION-CURABLE DESICCANT-FILLED ADHESIVE/SEALANT

(75) Inventors: Jie Cao, Hillsborough, NJ (US); Donald E. Herr, Doylestown, PA (US)

(73) Assignee: Henkel AG & Co. KGaA, Düsseldorf (DE)

( * ) Notice: Subject to any disclaimer, the term of this patent is extended or adjusted under 35 U.S.C. 154(b) by 571 days.

This patent is subject to a terminal disclaimer.

(21) Appl. No.: 11/098,117

(22) Filed: Apr. 4, 2005

(65) Prior Publication Data

US 2006/0223903 A1    Oct. 5, 2006

(51) Int. Cl.
*B32B 7/12* (2006.01)
*C09K 3/10* (2006.01)
*C09K 3/00* (2006.01)
*C08F 2/46* (2006.01)
*C08J 3/28* (2006.01)

(52) U.S. Cl. .......................... 428/1.5; 428/1.1; 428/345; 428/355 R; 428/355 EP; 428/355 AC; 428/508; 522/71; 522/74; 522/83; 522/90; 522/96; 522/100; 522/104; 522/107; 522/168; 522/170; 522/171; 522/181; 156/272.2; 156/275.1; 156/275.3; 156/326; 156/325; 524/107; 524/104

(58) Field of Classification Search .................. 522/90, 522/96, 100, 104, 107, 168, 170, 71, 74, 522/83, 181; 524/107, 114, 104; 156/272.2, 156/275.1, 275.3, 326, 325, 327, 330, 331.1; 428/1.1, 1.5, 345, 355 R, 355 EP, 508, 355 AC; 252/194

See application file for complete search history.

(56) References Cited

U.S. PATENT DOCUMENTS

| 2,830,721 | A | 4/1958 | Pinsky et al. |
| 3,704,806 | A | 12/1972 | Plachenov et al. |
| 3,835,003 | A | 9/1974 | Schlesinger |
| 4,013,566 | A | 3/1977 | Taylor |
| 4,036,360 | A | 7/1977 | Deffeyes |
| 4,081,397 | A | 3/1978 | Booe |
| 4,394,403 | A | 7/1983 | Smith |
| 5,122,403 | A | 6/1992 | Roginski et al. |
| 5,304,419 | A | 4/1994 | Shores |
| 5,401,536 | A | 3/1995 | Shores |
| 5,463,084 | A | 10/1995 | Crivello et al. |
| 5,591,379 | A | 1/1997 | Shores |
| 5,703,394 | A | 12/1997 | Wei et al. |
| 5,747,363 | A | 5/1998 | Wei et al. |
| 5,882,842 | A | 3/1999 | Akaki et al. |
| 6,081,071 | A | 6/2000 | Rogers |
| 6,084,004 | A | 7/2000 | Weinmann et al. |
| 6,121,358 | A | 9/2000 | Dershem et al. |
| 6,150,479 | A | 11/2000 | Klemarczyk et al. |
| 6,211,320 | B1 | 4/2001 | Dershem et al. |
| 6,226,890 | B1 | 5/2001 | Boroson et al. |
| 6,521,731 | B2 | 2/2003 | Dershem et al. |
| 6,569,532 | B2 | 5/2003 | Tomiyoshi et al. |
| 6,586,496 | B1 | 7/2003 | Takamatsu et al. |
| 6,692,610 | B2 | 2/2004 | Low et al. |
| 6,692,986 | B1 | 2/2004 | Bayer et al. |
| 6,706,779 | B2 | 3/2004 | Bahadur et al. |
| 6,835,950 | B2 * | 12/2004 | Brown et al. ................... 257/40 |
| 2003/0020398 | A1 | 1/2003 | Booth, Jr. et al. |
| 2003/0037677 | A1 | 2/2003 | Boroson et al. |
| 2003/0062125 | A1 | 4/2003 | Takamatsu et al. |
| 2003/0111519 | A1 | 6/2003 | Kinney et al. |
| 2004/0084686 | A1 | 5/2004 | Wang et al. |
| 2004/0191566 | A1 | 9/2004 | Kikuchi et al. |
| 2004/0225025 | A1 | 11/2004 | Sullivan et al. |
| 2007/0043136 | A1* | 2/2007 | Cao et al. ...................... 522/71 |

FOREIGN PATENT DOCUMENTS

| EP | 0 500 382 | | 12/1996 |
| EP | 0951947 | A1 | 10/1999 |
| EP | 0 776 147 | | 8/2001 |
| EP | 1 277 776 | | 1/2003 |
| JP | 56079170 | A | 11/1979 |
| JP | 2003-327951 | | 11/2003 |
| JP | 2003-327951 | A2 | 11/2003 |
| JP | 2005302401 | A | 4/2004 |
| WO | WO 97/46052 | | 12/1997 |
| WO | WO 03/088371 | | 10/2003 |
| WO | WO2004/009720 | A2 | 1/2004 |

OTHER PUBLICATIONS

Adhesives Research, Inc. General Electronic Assembly product guide, 2008. [online retrieved on Feb. 1, 2008]. Retrieved from the Internet:<URL: http://www.adhesiveresearch.com/content/view/61/110/.*
3M. Ultra-Clean Laminating Ashesives: 501FL, 502FL,504FL techical data sheet. Feb. 1999. [retrieved online Feb. 1, 2008]. Retrieved from the internet:<URL http://multimedia.mmm.com/mws/mediawebserver. dyn?6666660Zjcf6IVs6EVs666U8ZCOrrrrQ-.*
3M. Optically Clear Laminating Adhesives: 8180,8182,8185,8187,8188,8189, technical data sheet. Dec. 2007. [retrieved online Feb. 1, 2008]. Retrieved fron the internet: <URL http://multimedia.mmm.com/mws/mediawebserver. dyn?6666660Zjcf6IVs6EVs666y8GCOrrrrQ-.*
3M. Optically Clear Laminating Adhesives: 8141,8142,8161,9483, technical data sheet. Jun. 2006. [retrieved online Feb. 1, 2008]. Retrieved from Internet:<URLhttp://multimedia.mmm.com/mws/mediawebserverdyn?6666660Zjcf6IVs6EVs666y8GCOrrrrQ-.*
Crivello, J. V.: "Newer Aspects Of Photoinitiated Cationic Polymerization"; 1999 Kluwer Academic Publishers, Netherlands; pp. 45-60.

(Continued)

*Primary Examiner*—Sanza L McClendon
(74) *Attorney, Agent, or Firm*—Jane E. Gennaro

(57) ABSTRACT

A radiation-curable desiccant-filled adhesive/sealant composition comprising a radiation-curable resin, one or more desiccant fillers, one or more photoinitiators or photosensitizers, and optionally, one or more inorganic or organic fillers.

3 Claims, 1 Drawing Sheet

OTHER PUBLICATIONS

Vara, F. J.: "Vinyl Ether In UV and EB Induced Cationic Curing"; Water-Borne Symposium, 2/22 and 2/23, 1990, New Orleans, LA; pp. 9-29.

Matsuda, T.: Material Safety Data Sheet for Shin-Nakamura Chemical Co., Ltd.; Wakayama City, Japan; for NK ESTER A-DCP; Sep. 30, 2003.

Vara, Fulvio J., et al., Proceedings of the Water-Borne and Higher Solids Coatings Symposium, 1990, 17th, pp. 9-29.

Crivello, James V., et al., "Proceedings from Radiation Curing," Chicago, IL, Sep. 1982, pp. 4-28.

Kim, Gi Heon, et al., "Encapsulation of Organic Light-Emitting Devices by Means of Photogpolymerized Polyacrylate Films," Science Direct, 2004, pp. 1879-1883.

Lange, J. et al, Influence of structure and chemical composition on oxygen permeability..., 2002, Elsevier Science Ltd., pp. 5985-5994.

Weinmann, D.J. et al, Amine-Functional Curatives for Low Temperature Cure Epoxy Coatings, 2001, ResolutionPerformance Products, LLC, pp. 2-16.

Liao, Tung-Ping et al, New Telechelic Polymers and Sequential Copolymers by Polyfunctional . . . , 1981, Polymer Bulletin 6, pp. 135-141.

Ivan, Bela et al, Living Carbocationic Polymerization—XX. Synthesis of Allyl-Telechelic . . . Instit. of Polymer Science, Univ. of Akron, pp. 869-872.

Ivan, Bela et al, Living Carbocationic Polymerization—XXX. One-Pot Synthesis of Allyl-Terminated . . . 1990, Journal of Polymer Science, pp. 90-115.

Pernecker, Tibor et al, Macromers by Carbocationic Polymerization . . . , 1991, Polymer Bulletin 25, pp. 633-640.

Merrill, Natalie A. et al, Radiation Curing of Butyl Polymers for Pressure Sensitive Adhesives (Abstract), Exxon Chemical Co., pp. 77-86.

Bahadur, Maneesh et al, UV Curable Polyisobutylene Oligomers for Photonic Applications (Abstract), 2004, Dow Corning Corp., Midland, MI, USA.

* cited by examiner

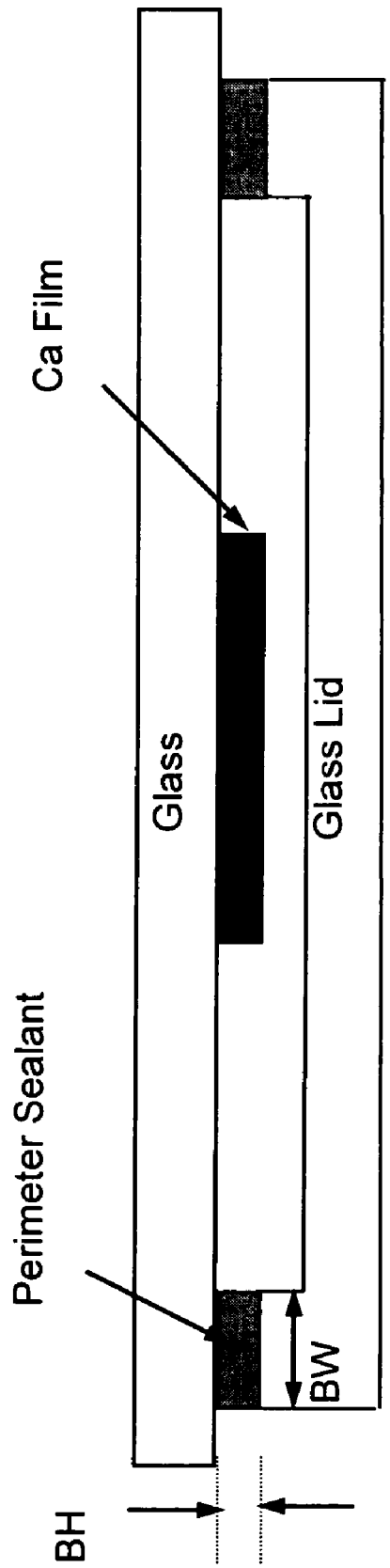
FIGURE 1   CALCIUM-BUTTON DEVICE
BH: bondline height (thickness).
BW: bondline width.
Glass: substrate
Lid: glass or metal lid

RADIATION-CURABLE DESICCANT-FILLED ADHESIVE/SEALANT

This Invention was made with support from the Government of the United States of America under Agreement No. MDA972-93-2-0014 awarded by the Army Research Laboratories. The Government has certain rights in the Invention.

FIELD OF THE INVENTION

This invention relates to radiation-curable desiccant-filled adhesives or sealants. In a preferred embodiment, it relates to desiccant-filled perimeter adhesives and sealants for electronic and optoelectronic devices, such as organic light emitting diodes.

BACKGROUND OF THE INVENTION

It is well known that a variety of packaged electronic devices require moisture protection to achieve a specified operating or storage lifetime. In particular, the relative humidity within the encapsulated packages of highly moisture-sensitive electronic devices, such as organic light-emitting devices (OLED), polymer light-emitting devices, charge-coupled device (CCD) sensors and micro-electro-mechanical sensors (MEMS), must be controlled below a certain level, particularly below 1000 ppm or even in some cases below 100 ppm, in order to fully protect the organic light-emitting layers, electrodes, or other moisture-sensitive components.

There are several approaches used in the prior art to protect encapsulated or packaged devices from water. These techniques do not always work: organic sealants may not meet the stringent moisture permeation requirement; moisture impermeable solder sealants may have melting temperatures that are too high for temperature sensitive devices; and desiccant packages attached on the device inner wall may block light emission out of the device, a particular problem for top-emitting organic light-emitting diodes.

SUMMARY OF THE INVENTION

This invention is a radiation-curable desiccant-filled material that has the properties of both a sealant and an adhesive, hereinafter, sealant/adhesive. These materials are suitable for sealing highly moisture-sensitive electronic, optoelectronic, or similar devices. In these sealant/adhesive compositions the material not only acts as a moisture barrier, but also absorbs, adsorbs, or chemically reacts with any permeating water or water vapor. The materials are capable of bonding two substrates together to form a sealed enclosure after radiation curing of the adhesive.

The radiation-curable desiccant-filled adhesive/sealant comprises (a) one or more radiation curable resins; (b) one or more fillers that absorb, adsorb, or chemically react with water or water vapor; (c) one or more photoinitiators and/or photosensitizers;

Optionally, the adhesive/sealant may also contain one or more reactive or non-reactive resins, one or more inorganic fillers, or one or more adhesion promoters.

BRIEF DESCRIPTION OF THE DRAWINGS

FIG. 1 depicts a calcium button device in which a lid is attached to a substrate with a perimeter sealant disposed at the interface of the perimeter of the lid and the substrate,

DETAILED DESCRIPTION OF THE INVENTION

All references cited herein are incorporated in their entirety by reference. In this specification the term radiation curing refers to the cure of a resin or resin/filler system through exposure to actinic radiation. Actinic radiation is electromagnetic radiation that induces a chemical change in a material, and for purposes within this specification and claims will include electron-beam curing. In most cases, such radiation is ultraviolet (UV) or visible light. The initiation of this cure is achieved through the use of an appropriate photoinitiator.

Suitable radiation-curable resins include any of the radiation-curable resins known to those with experience in the field of UV curable materials and filled polymer composites. The resins may be small molecules, oligomers, or polymers, and will be chosen by the practitioner as appropriate for the end use application. The particular desiccant filler chosen may also be varied depending on the moisture scavenging and moisture barrier requirements needed for a particular optoelectronic or electronic device. The cure mechanism also may vary (cationic, radical, etc.), although preferably it will be compatible with the fillers and desiccant fillers used (for example, some alkaline desiccants or fillers may inhibit a cationically UV curable resin system).

Although the materials used for these compositions are known, the essence of this invention resides in the formulation of an adhesive/sealant that is filled with desiccant and that is curable by radiation.

The backbone of the radiation-curable resins is not limited. The reactive functionalities on the resins will be those reactive to the initiators or catalysts formed by exposure to radiation and include, but are not limited to, epoxies, selected from glycidyl epoxy, aliphatic epoxy, and cycloaliphatic epoxy; oxetane; acrylate and methacrylate; itaconate; maleimide; vinyl, propenyl, crotyl, allyl, and propargyl ether and thioethers of those groups; maleate, fumarate, and cinnamate esters; styrenic; acrylamide and methacrylamide; chalcone; thiol; allyl, alkenyl, and cycloalkenyl groups.

Suitable cationic polymerizable radiation-curable resins include epoxies, oxetanes, vinyl ethers, and propenyl ethers. Representative epoxy resins are glycidyl ethers and cycloaliphatic epoxies, which are commercially available from a number of sources known to those skilled in the art.

Representative aromatic liquid glycidyl ethers include bisphenol F diglycidyl ether (sold under the trade name Epikote 862 from Resolution Performance Products) or bisphenol A diglycidyl ether (sold under the trade name Epikote 828 from Resolution Performance Products). Representative solid glycidyl ethers include tetramethylbiphenyidiglycidyl ether (sold under the trade name RSS 1407) and resorcinol diglycidyl ether (sold under the trade name Erisys RDGE® available from CVC Specialty Chemicals, Inc.). Other aromatic glycidyl ethers are commercially available under the trade names Epon 1031, Epon 164, and SU-8 available from Resolution Performance Products.

Representative non-aromatic glycidyl epoxy resins include an hydrogenated bisphenol A diglycidylether (sold under the trade name EXA-7015 from Dainippon Ink & Chemicals) or cyclohexanedimethylol diglycidyl ether available from Aldrich Chemical Co.

Representative cycloaliphatic epoxy resins include ERL 4221 and ERL 6128 available from Dow Chemical Co. A representative oxetane resin is OXT-121 available from Toagosei. Representative vinyl ether molecules include cyclohexanedimethylol divinyl ether (Rapicure-CHVE), tripropylene glycol divinyl ether (Rapicure-DPE-3) or dodecyl vinyl ether (Rapicure-DDVE) all available from International Specialty Products. Analogous vinyl ethers are also available from BASF.

Suitable radically polymerizable radiation-curable resins include acrylates, maleimides, or thiol-ene based resins. In many cases, combinations of these three resins can be utilized to tailor the properties of the sealant/adhesive material.

Representative acrylate resins include hexane diol diacrylate, trimethylolpropane triacrylate, cyclohexanedimethylol diacrylate, dicyclo-pentadienedimethylol diacrylate, tris(2-hydroxyethyl)isocyanurate triacrylate, poly(butadiene) dimethacrylate, and bisphenol A based acrylated epoxy. Such resins are commercially available from Sartomer and UCB Chemicals.

Representative liquid maleimide resins are described, for example, in U.S. Pat. Nos. 6,265,530, 6,034,194, and 6,034,195, which are incorporated herein in their entirety by this reference. Particularly suitable maleimide resins have the structures MacDermid Acumen, Inc. Other useful polyenes include diallylchlorendate (sold under the trade name BX-DAC) and tetraallylbisphenol A, both available from Bimax, Inc.

Additional suitable radiation-curable resins, and photoinitiators for those resins, will include those found in literature sources such as Fouassier, J-P., *Photoinitiation, Photopolymerization and Photocuring Fundamentals and Applications* 1995, Hanser/Gardner Publications, Inc., New York, N.Y.

The selection of a photoinitiating system for the inventive radiation curable barrier materials is familiar to those skilled in the art of radiation curing. The photoinitiating system will comprise one or more photoinitiators and optionally one or more photosensitizers. The selection of an appropriate photoinitiator is highly dependent on the specific application in which the barrier sealant is to be used. A suitable photoinitiator is one that exhibits a light absorption spectrum that is distinct from that of the resins, fillers, and other additives in the radiation curable system.

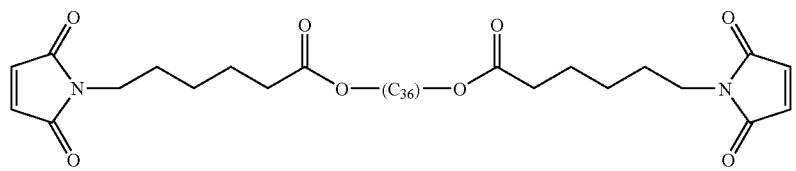

in which ($C_{36}$) represents a hydrocarbon moiety having 36 carbons, which can be a straight or branched chain, with or without cyclic structures;

If the sealant must be cured through a cover or substrate, the photoinitiator will be one capable of absorbing radiation at wavelengths for which the cover or substrate is transparent.

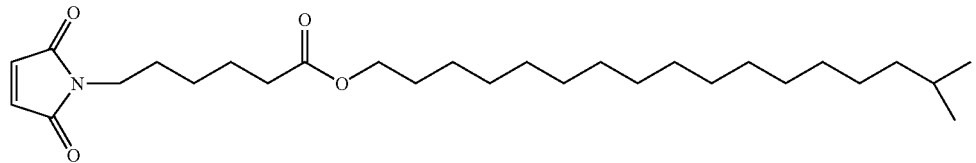

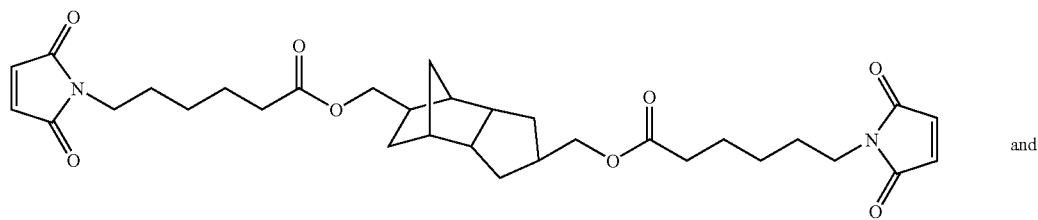

and

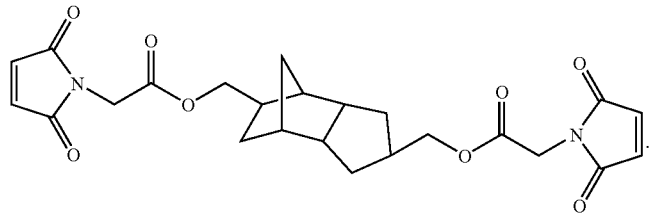

Representative thiol-ene radically photopolymerizable systems include the pentaerythritoltetrakis(3-mercaptopropionate)/triallyl-isocyanurate system. Other useful thiols include those described in U.S. Pat. No. 5,919,602 issued to For example, if a barrier sealant is to be cured through a sodalime glass coverplate, the photoinitiator must have significant UV absorbance above ca. 320 nm. UV radiation below 320 nm will be absorbed by the sodalime glass coverplate and not reach the photoinitiator. In this example, it would be beneficial to include a photosensitizer with the photoinitiator into the photoinitiating system, to augment the transfer of energy to the photoinitiator.

For cationically photopolymerizable systems, the most useful photoinitiators are diaryliodonium salts and triarylsulfonium salts containing anions such as, but not limited to fluorinated anions, such as $BF_4^-$, $PF_6^-$, $AsF_6^-$ or $SbF_6^-$. Commercially available representative iodonium salts include PC2506 (Polyset), UV9380C (GE silicones), and Rhodorsil 2074 (Rhodia). Other suitable cationic photoinitiators are sulfonium salts, a representative sulfonium salt being UVI-6974 (Dow Chemical). Depending on the application, photosensitizers such as isopropylthioxanthone (ITX) and chloropropoxythioxanthone (CPTX), both available from Aldrich and other vendors, are useful in combination with iodonium salt photoinitiators. Radical photoinitiators are available from Ciba Specialty Chemicals and other vendors. Representative useful radical photointiators from Ciba include Irgacure 651, Irgacure 819, and Irgacure 907. Other photoinitiators are disclosed in *Ionic Polymerizations and Related processes,* 45-60, 1999, Kluwer Academic Publishers; Netherlands; J. E. Puskas et al. (eds.). Photoinitiators will be used in amounts ranging from 0.1 wt % to 10 wt %.

Inorganic fillers that are not desiccants (also referred to as non-desiccant fillers within this specification and the claims) may be used to improve the material properties or the rheology of the compositions. There are many such fillers that are useful in the inventive UV curable sealants/adhesives. Representative non-desiccant fillers include, but are not limited to, ground quartz, fused silica, amorphous silica, talc, glass beads, graphite, carbon black, alumina, clays, mica, aluminum nitride, and boron nitride. Metal powders and flakes consisting of silver, copper, gold, tin, tin/lead alloys, and other alloys also are suitable fillers for conductive applications. Organic filler powders such as poly-(tetrachloroethylene), poly(chlorotrifluoroethylene), poly(vinylidene chloride) may also be used. The type and amount of such fillers suitable for use in radiation-curable compositions is within the expertise of the practitioner skilled in the art. Generally, however, such fillers will be present in amounts ranging from 1 wt % to 90 wt %. of the total formulation.

The fillers with desiccant properties (referred to as desiccant fillers within this specification and the claims) suitable for use may be any of those that provide an appropriate moisture scavenging rate, capacity, and residual moisture level (the lowest level of moisture at which the desiccant can actively scavenge water) to meet the allowable moisture level for the specific device. The desiccant fillers will be capable of reacting with, absorbing, or adsorbing water and/or water vapor. A representative list of such desiccants can be found in Dean, J. *Lange's Handbook of Chemistry,* 1999, McGraw Hill, Inc., New York, N.Y., pp. 11.5.

In general, suitable desiccants include but are not limited to metal oxides (such as, CaO, BaO, MgO); other oxides (such as $SiO_2$, $P_2O_5$, $Al_2O_3$); metal hydrides (such as $CaH_2$, NaH, $LiAlH_4$); metal salts (such as $CaSO_4$, $Na_2SO_4$, $MgSO_4$, $CaCO_3$, $K_2CO_3$, and $CaCl_2$); powdered zeolites (such as 4A and 3A molecular sieves); metal perchlorates, such as, $Ba(ClO_4)_2$, $Mg(ClO_4)_2$; superabsorbant polymers, such as, lightly crosslinked poly(acrylic acid); and metals that react with water, such as calcium.

As with any filler, the desiccant filler particle size, particle size distribution, shape, and surface functionality will affect the level to which it can be loaded into a resin system and what rheology may result. Such factors are understood by those skilled in the art and are not otherwise relevant to the current inventive compositions. Blends of the more common non-desiccant fillers disclosed above and these desiccant fillers are contemplated and described within the examples.

A common range for the particle size of the desiccant filler is from 0.001 to 200 micrometers. The practitioner with skill in the art will be able to determine the appropriate particle size range for the resin, rheology, and scavenging rate needed for the particular end use application.

In a further embodiment, this invention is an electronic or optoelectronic device, disposed on a substrate and encapsulated with a lid in which the lid and substrate are bonded together with a desiccant-filled sealant/adhesive, the desiccant-filled sealant/adhesive being as described above in this specification. In one embodiment, the desiccant-filled sealant/adhesive is disposed along the perimeter junction of the substrate and lid.

EXAMPLES

The moisture barrier performance of perimeter sealants can be evaluated by a test known as the Ca-button test, in which the time is measured for which it takes a thin film of calcium metal encapsulated into a device to decay to a calcium salt through reaction with water. The longer the lifetime of the calcium metal film before decay, the lower the moisture permeation into the device and the better the sealant/adhesive protecting the device.

A Ca-button device as used in these examples is shown in FIG. 1, in which BH is the bondline height (thickness) of the perimeter sealant/adhesive; BW is the bondline width of the perimeter sealant/adhesive; glass is the substrate on which the calcium metal film is disposed; and lid is the glass or metal lid used to encapsulate the resultant device.

The device was assembled in a $N_2$-filled glove box. A thin Ca film was first evaporated on a glass wafer by vapor deposition to a thickness of 100 nm and a diameter of 8.0 mm. The Ca film was encapsulated by a lid using a perimeter sealant/adhesive that was pre-applied on the lip of the lid. The sealant joint was cured by a UV-radiation spot cure unit to bind the substrate and the lid together with a dose of 3.0 $J/cm^2$ of UV-A radiation.

The sealed Ca-button device was placed in an environment controlled to 65° C./80% RH (relative humidity). Initially, the calcium metal film is a metallic mirror capable of reflecting light. Upon exposure to moisture the metallic film turns to a calcium salt, becomes transparent, and no longer reflects. The calcium film in the button device was continuously monitored by a proprietary reflectance unit in order to identify the time when the calcium metal film was fully decayed. Since moisture can only permeate into the enclosed device through the exposed sealant layer, the lifetime of a Ca-button can be used to evaluate moisture barrier performance.

Example perimeter sealant/adhesive compositions were prepared for water permeability testing using the Ca-button test by mixing the composition components in a FlackTek Speedmixer™ immediately before application to the Ca-button device. The compositions were applied to the Ca-button device in a $N_2$ filled glove box to avoid moisture absorption by the Ca-button and desiccants. Each example contains two sample sets representing the same composition both with and without desiccant. Sample compositions (in weight percentages) and results for the Ca-button test for all examples are summarized in Table 1.

Example 1

Formulations were prepared as recited above to contain a diacrylate radiation-curable resin, a silica filler, and a radical photoinitiator. Formulation 1(a) contained no desiccant; formulation 1(b) contained calcium sulfate (CaSO$_4$) as a desiccant. In this example, the device lid was a glass lid (26 mm×15.5 mm×1.1 mm) (L×W×H) and the perimeter sealant had a 2.5 mm bondline width.

Example 2

Formulations were prepared as recited above to contain a mixture of the diacrylate and an aliphatic rubber, a silica filler, and a radical photoinitiator. Formulation 2(a) contained no desiccant; formulation 2(b) contained CaSO$_4$ as desiccant; formulation 2(c) contained CaO as desiccant. In this example, the device lid was a glass lid (26 mm×15.5 mm×1.1 mm) (L×W×H) and the perimeter sealant had a 2.5 mm bondline width.

Example 3

Formulations were prepared as recited above to contain a mixture of a radiation-curable (cationic) epoxy resin, a talc filler, a cationic photoinitiator, and a photosensitizer (isopropylthioxanthone). Formulation 3(a) contained no desiccant; formulation 3(b) contained powdered molecular sieves as desiccant; formulation 3(c) contained powdered molecular sieve as desiccant at a different loading level from 3(b). In this example, the device lid was a stainless steel lid (27 mm×27 mm×6.1 mm) (L×W×H) and the perimeter sealant had a 1.3 mm bondline width.

TABLE 1

Comparison of Barrier Performance of Sealants/Adhesives Based on Ca-button Lifetime Measurement.

Composition in Parts by weight

| Example | Resin | Filler Non-Desiccant | Desiccant | Photo-Initiator | Bondline Thickness (mil) | Lifetime (hours) |
|---|---|---|---|---|---|---|
| 1-a radical cure | 50 | 50 silica | | 0.5 | 2 | 42 |
| 1-b radical cure | 50 | 25 silica | 25 CaSO$_4$ | 0.5 | 2 | 207 |
| 2-a radical cure | 50 | 50 silica | | 0.5 | 1 | 28 |
| 2-b radical cure | 50 | 25 silica | 25 CaSO$_4$ | 0.5 | 1 | 326 |
| 2-c radical cure | 50 | 25 silica | 25 CaO | 0.5 | 8.3 | 252 |
| 3-a cationic cure | 54 | 45 talc | | 1 | 2 | 26 |
| 3-b cationic cure | 52 | 23 talc | 23 molecular sieve | 1.5 | 2 | 92 |
| 3-c cationic cure | 46 | 20 talc | 33 molecular sieve | 1 | 2 | 50 |

The results indicate that sealant/adhesive formulations containing desiccants show improved moisture barrier performance compared to sealant/adhesive formulations without desiccants, implying that desiccants can effectively absorb moisture within a sealant/adhesive composition and that the lifetime increase is attributable to the moisture absorbing capability of the desiccant, which causes the delay of moisture permeation through the sealant/adhesive. Moreover, no loss of adhesion or other mechanical properties was observed in the formulations containing the desiccants.

What is claimed:

1. An electronic or optoelectronic device, disposed on a substrate and encapsulated with a lid in which the lid and substrate are bonded together with a desiccant-filled sealant/adhesive along the perimeter of the substrate and lid, the desiccant-filled sealant/adhesive consisting essentially of
    a) a radiation-curable resin containing reactive functionality selected from the group consisting of glycidyl epoxy, aliphatic epoxy, cycloaliphatic epoxy; oxetane; acrylate, methacrylate, itaconate; maleimide; vinyl, propenyl, crotyl, allyl, and propargyl ether and thio-ethers of those groups; maleate, fumarate, and cinnamate esters; styrenic; acrylamide and methacrylamide; chalcone; thiol; allyl, alkenyl, and cycloalkenyl groups;
    b) one or more desiccant fillers,
    c) a photoinitiating system comprising one or more photoinitiators and optionally one or more photosensitizers.

2. The electronic or optoelectronic device in accordance with claim 1 in which the one or more desiccant fillers are selected from the group consisting of metal oxides, metal sulfates, metal hydrides, metal halides, metal perchlorates, metal carbonates, phosphorus pentoxide, metals that react with water, superabsorbant polymers, zeolites, molecular sieves, activated alumina, activated silica gel, and combinations thereof.

3. The electronic or optoelectronic device in accordance with claim 1 in which the desiccant fillers are selected from the group consisting of CaO, BaO, MgO, SiO$_2$, P$_2$O$_5$, Al$_2$O$_3$, CaH$_2$, NaH, LiAlH$_4$, CaSO$_4$, Na$_2$SO$_4$, MgSO$_4$, CaCO$_3$, K$_2$CO$_3$, CaCl$_2$, 4A and 3A molecular sieves, Ba(ClO$_4$)$_2$, Mg(ClO$_4$)$_2$; lightly crosslinked poly(acrylic acid) and Ca.

* * * * *